(12) United States Patent
Yamashita et al.

(10) Patent No.: US 9,093,519 B2
(45) Date of Patent: Jul. 28, 2015

(54) WAFER PROCESSING METHOD

(71) Applicant: DISCO CORPORATION, Tokyo (JP)

(72) Inventors: Yohei Yamashita, Tokyo (JP); Kenji Furuta, Tokyo (JP); Yoshiaki Yodo, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/504,059

(22) Filed: Oct. 1, 2014

(65) Prior Publication Data

US 2015/0099346 A1    Apr. 9, 2015

(51) Int. Cl.
*H01L 21/78* (2006.01)
*H01L 21/302* (2006.01)
*H01L 21/683* (2006.01)
*H01L 21/02* (2006.01)
*H01L 21/268* (2006.01)

(52) U.S. Cl.
CPC .......... *H01L 21/78* (2013.01); *H01L 21/02013* (2013.01); *H01L 21/02016* (2013.01); *H01L 21/268* (2013.01); *H01L 21/302* (2013.01); *H01L 21/6836* (2013.01); *H01L 2221/6834* (2013.01); *H01L 2221/68327* (2013.01)

(58) Field of Classification Search
CPC ..... H01L 21/78; H01L 21/302; H01L 21/304; H01L 21/3043; H01L 21/6836

USPC .......... 438/110, 113, 114, 462, 463, 464, 465
See application file for complete search history.

(56) References Cited

U.S. PATENT DOCUMENTS

2012/0100696 A1*    4/2012   Nakamura ................. 438/463

FOREIGN PATENT DOCUMENTS

JP           2002-192370         7/2002

* cited by examiner

*Primary Examiner* — Thanhha Pham
(74) *Attorney, Agent, or Firm* — Greer Burns & Crain, Ltd.

(57) ABSTRACT

In a wafer processing method, the back side of the wafer is ground to reduce the thickness of the wafer to a predetermined thickness. A modified layer is formed by applying a laser beam to the wafer from the back side of the wafer along each division line with the focal point of the laser beam set inside the wafer. The wafer is mounted on a reinforcing sheet having an insulating function on the back side of the wafer and a dicing tape is attached to the reinforcing sheet. The peripheral portion of the dicing tape is supported by an annular frame. The wafer is heated, which also heats the reinforcing sheet, thereby hardening the reinforcing sheet. An external force is applied to the wafer to divide the wafer into individual devices along each division line and to also break the reinforcing sheet along the individual devices.

6 Claims, 12 Drawing Sheets

WAFER PROCESSING METHOD

BACKGROUND OF THE INVENTION

1. Field of the Invention

The present invention relates to a wafer processing method for dividing a wafer into individual devices along a plurality of crossing division lines formed on the front side of the wafer, the individual devices being formed in a plurality of separate regions defined by the division lines.

2. Description of the Related Art

In a semiconductor device fabrication process, a plurality of crossing division lines are formed on the front side of a substantially disk-shaped semiconductor wafer to thereby define a plurality of separate regions where a plurality of devices such as ICs and LSIs are formed. The semiconductor wafer is cut along the division lines to thereby divide the regions where the devices are formed from each other, thus obtaining the individual devices as device chips.

Cutting of the semiconductor wafer along the division lines is usually performed by using a cutting apparatus called a dicing saw. This cutting apparatus includes a chuck table for holding a workpiece such as a semiconductor wafer and an optical device wafer, cutting means for cutting the workpiece held on the chuck table, and feeding means for relatively moving the chuck table and the cutting means. The cutting means includes a spindle unit having a rotating spindle, a cutting blade mounted on the rotating spindle, and a driving mechanism for rotationally driving the rotating spindle. The cutting blade includes a disk-shaped base and an annular cutting edge mounted on one side surface of the base along the outer circumference thereof. The annular cutting edge is an electroformed diamond blade formed by bonding diamond abrasive grains having a grain size of about 3 μm, for example, to the base until reaching a thickness of about 20 μm.

However, since the cutting edge of the cutting blade has a thickness of about 20 μm, each division line separating the devices must have a thickness of about 50 μm. Accordingly, the ratio in area of the division lines to the wafer is large, causing a reduction in productivity.

As a method of dividing a wafer such as a semiconductor wafer in recent years, there has been tried a laser processing method called internal processing of applying a pulsed laser beam having a transmission wavelength to the wafer along the division lines in the condition where the focal point of the pulsed laser beam is set inside the wafer in a subject area to be divided. More specifically, this wafer dividing method using laser processing called internal processing includes the steps of applying a pulsed laser beam having a transmission wavelength to the wafer from one side of the wafer along the division lines in the condition where the focal point of the pulsed laser beam is set inside the wafer to thereby continuously form a modified layer inside the wafer along each division line and next applying an external force to the wafer along each division line where the modified layer is formed to be reduced in strength, thereby breaking the wafer along each division line to obtain the individual devices (see Japanese Patent No. 3408805, for example).

SUMMARY OF THE INVENTION

A plurality of functional layers constituting each device are stacked on the front side of the wafer. Accordingly, the pulsed laser beam must be applied from the back side of the wafer in performing the internal processing in the condition where the focal point of the pulsed laser beam is set inside the wafer. However, in a wafer forming a stacked semiconductor device including a plurality of vertically stacked device layers, a reinforcing sheet having an insulating function is preliminarily mounted on the back side of the wafer. Accordingly, the laser beam is interrupted by the reinforcing sheet, so that the internal processing cannot be performed from the back side of the wafer.

It is therefore an object of the present invention to provide a wafer processing method which can perform the internal processing even in the case of attaching a reinforcing sheet having an insulating function to the back side of a wafer.

In accordance with an aspect of the present invention, there is provided a wafer processing method for dividing a wafer into individual devices along a plurality of crossing division lines formed on the front side of the wafer, the individual devices being formed in a plurality of separate regions defined by the division lines, the wafer processing method including a protective member attaching step of attaching a protective member to the front side of the wafer; a back grinding step of holding the protective member attached to the front side of the wafer by the protective member attaching step on a chuck table of a grinding apparatus and grinding the back side of the wafer to reduce the thickness of the wafer to a predetermined thickness; a modified layer forming step of holding the protective member attached to the wafer ground by the back grinding step on a chuck table of a laser processing apparatus and applying a laser beam having a transmission wavelength to the wafer from the back side of the wafer along each division line in the condition where the focal point of the laser beam is set inside the wafer to thereby form a modified layer inside the wafer along each division line; a wafer supporting step of mounting a reinforcing sheet having an insulating function on the back side of the wafer processed by the modified layer forming step, attaching a dicing tape to the reinforcing sheet, and supporting the peripheral portion of the dicing tape to an annular frame; a reinforcing sheet heating step of heating the wafer processed by the wafer supporting step to heat the reinforcing sheet mounted on the back side of the wafer, thereby hardening the reinforcing sheet; and a dividing step of applying an external force to the wafer to thereby divide the wafer into the individual devices along each division line where the modified layer is formed and to also break the reinforcing sheet along the individual devices.

Preferably, the dividing step is performed before performing the reinforcing sheet heating step, and the reinforcing sheet heating step is performed after performing the dividing step. Preferably, the wafer supporting step includes the step of preliminarily attaching the reinforcing sheet to the dicing tape and next mounting the reinforcing sheet to the back side of the wafer.

In the wafer processing method according to the present invention, the wafer supporting step is performed after performing the modified layer forming step. In the modified layer forming step, the protective member attached to the wafer ground by the back grinding step is held on the chuck table of the laser processing apparatus. In this condition, a laser beam having a transmission wavelength to the wafer is applied from the back side of the wafer along each division line in the condition where the focal point of the laser beam is set inside the wafer to thereby form a modified layer inside the wafer along each division line. In the wafer supporting step, a reinforcing sheet having an insulating function is mounted on the back side of the wafer, a dicing tape is attached to the reinforcing sheet, and the peripheral portion of the dicing tape is supported to an annular frame. Accordingly, even in the case of attaching the reinforcing sheet to the back side of the wafer, it is possible to perform the modified layer forming step as internal processing of forming a modified layer inside the wafer along each division line. After performing the wafer supporting step, the dividing step is performed by applying an external force to the wafer. Accordingly, the wafer can be divided into the individual devices along each division line where the modified layer is formed, and the reinforcing sheet can also be broken along the individual devices.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
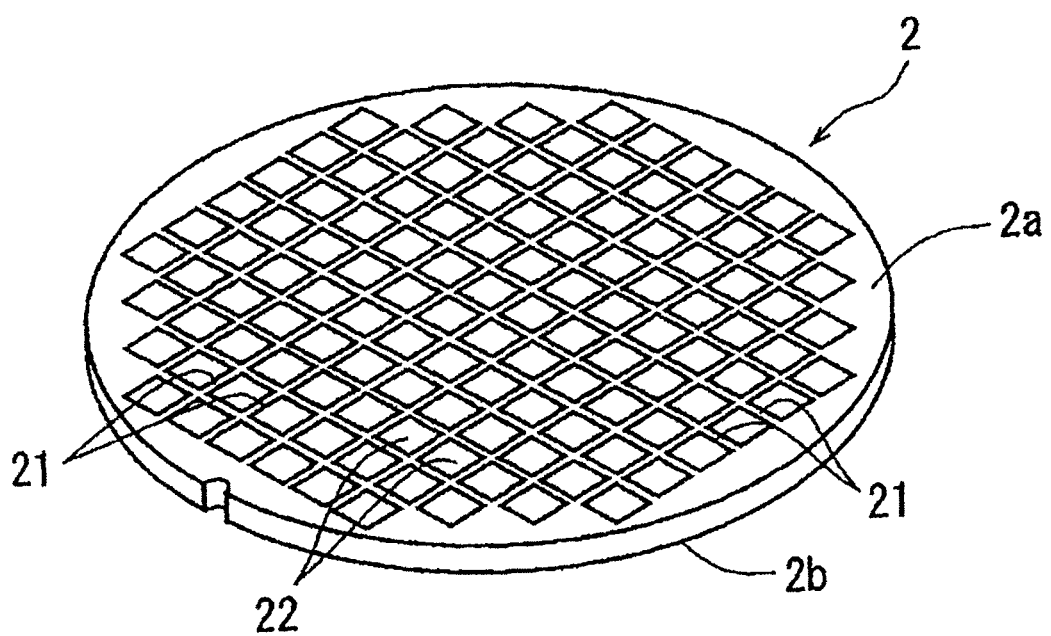
FIG. 1 is a perspective view of a semiconductor wafer to be divided by the wafer processing method according to the present invention.

A preferred embodiment of the wafer processing method according to the present invention will now be described in detail with reference to the attached drawings. FIG. 1 is a perspective view of a semiconductor wafer 2 to be processed in accordance with the present invention. The semiconductor wafer 2 shown in FIG. 1 is formed from a silicon wafer having a thickness of 500 μm, for example. The semiconductor wafer 2 has a front side 2a and a back side 2b. A plurality of crossing division lines 21 are formed on the front side 2a of the semiconductor wafer 2 to thereby define a plurality of separate regions where a plurality of devices 22 such as ICs and LSIs are formed. There will now be described a wafer processing method for dividing the semiconductor wafer 2 into the individual devices 22 along the division lines 21.

Figure 2A:
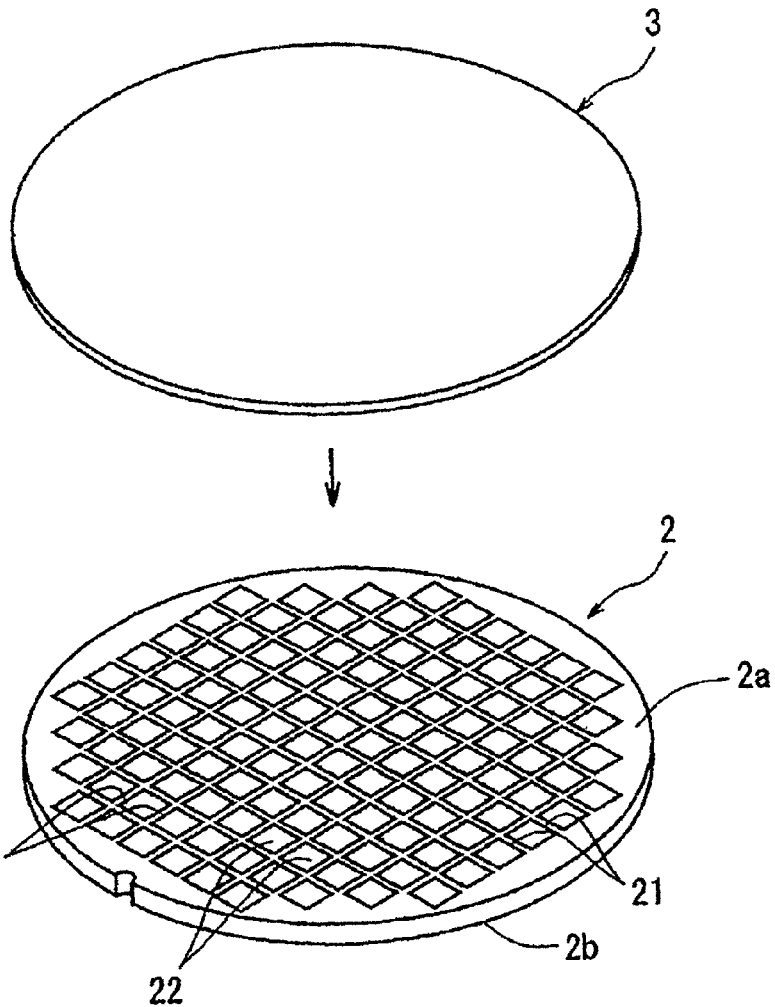
FIGS. 2A and 2B are perspective views for illustrating a protective member attaching step.
Figure 2B:
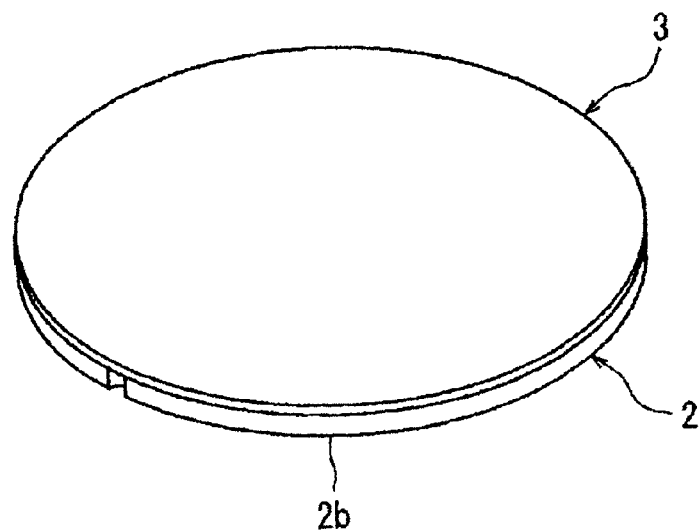

First, a protective member attaching step is performed in such a manner that a protective member is attached to the front side 2a of the semiconductor wafer 2 in order to protect the devices 22 formed on the front side 2a of the semiconductor wafer 2. More specifically, as shown in FIGS. 2A and 2B, a protective tape 3 as the protective member is attached to the front side 2a of the semiconductor wafer 2. The protective tape 3 includes a base sheet and an adhesive layer formed on the front side of the base sheet. The base sheet is formed of polyvinyl chloride (PVC) and has a thickness of 100 μm, for example. The adhesive layer is formed of acrylic resin and has a thickness of about 5 μm, for example.

After performing the protective member attaching step as mentioned above, a back grinding step is performed in such a manner that the protective member attached to the front side 2a of the semiconductor wafer 2 is held on a chuck table of a grinding apparatus and the back side 2b of the semiconductor wafer 2 is ground to reduce the thickness of the semiconductor wafer 2 to a predetermined thickness. This back grinding step is performed by using a grinding apparatus 4 shown in FIG. 3. The grinding apparatus 4 shown in FIG. 3 includes a chuck table 41 for holding a workpiece and grinding means 42 for grinding the workpiece held on the chuck table 41. The chuck table 41 has an upper surface as a holding surface for holding the workpiece under suction. The chuck table 41 is rotatable in the direction shown by an arrow 41a in FIG. 3 by a rotational driving mechanism (not shown). The grinding means 42 includes a spindle housing 421, a rotating spindle 422 rotatably supported to the spindle housing 421 so as to be rotated by a rotational driving mechanism (not shown), a mounter 423 mounted on the lower end of the rotating spindle 422, and a grinding wheel 424 mounted on the lower surface of the mounter 423. The grinding wheel 424 includes an annular base 425 and a plurality of abrasive members 426 fixed to the lower surface of the annular base 425 so as to be arranged annularly at given intervals. The annular base 425 is mounted on the lower surface of the mounter 423 by means of bolts 427.

Figure 3:
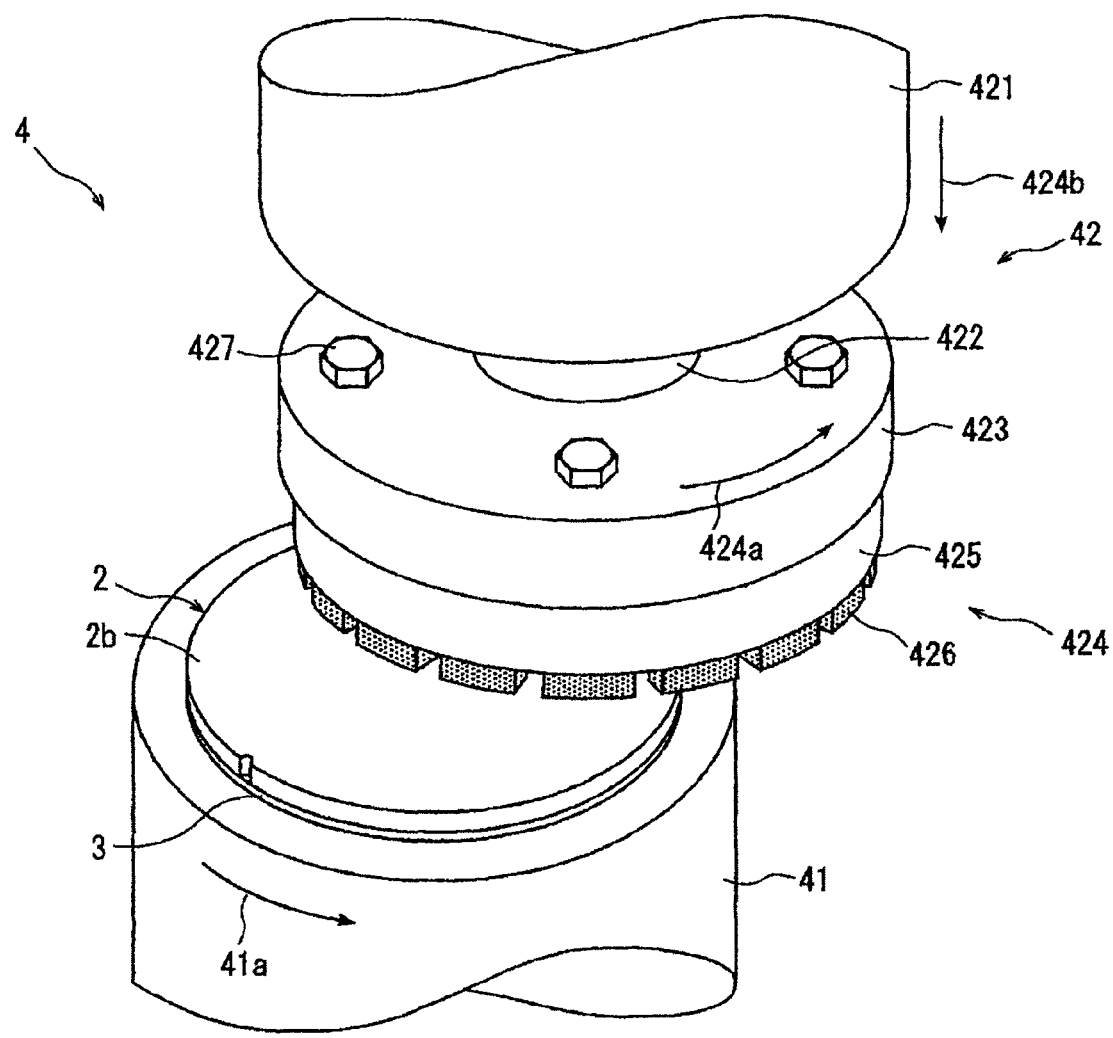
FIG. 3 is a perspective view of an essential part of a grinding apparatus for performing a back grinding step.
Figure 4:
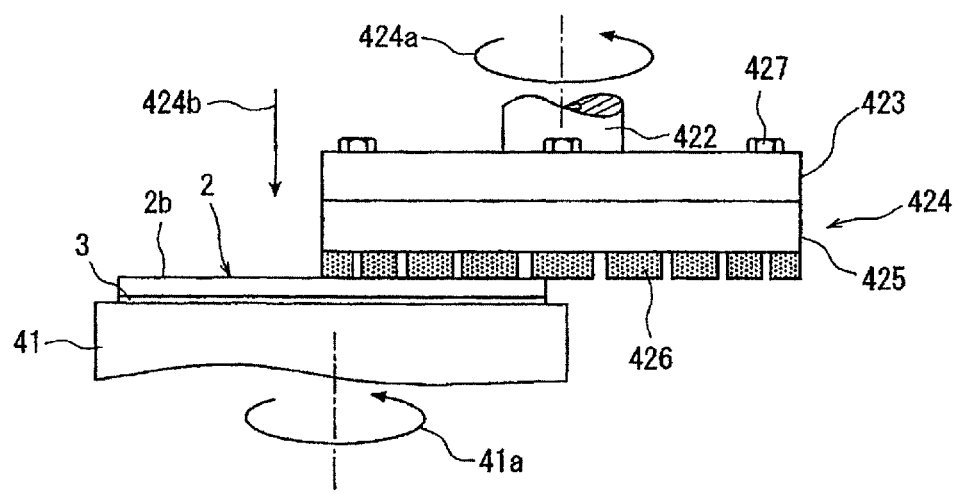
FIG. 4 is a side view for illustrating the back grinding step.

The back grinding step using the grinding apparatus 4 is performed in the following manner. As shown in FIG. 3, the semiconductor wafer 2 with the protective tape 3 is placed on the chuck table 41 in the condition where the protective tape 3 attached to the front side 2a of the semiconductor wafer 2 comes into contact with the upper surface (holding surface) of the chuck table 41. Thereafter, suction means (not shown) is operated to hold the semiconductor wafer 2 through the protective tape 3 on the chuck table 41 under suction (wafer holding step). Accordingly, the back side 2b of the semiconductor wafer 2 held on the chuck table 41 is oriented upward. Thereafter, the chuck table 41 is rotated at 300 rpm, for example, in the direction shown by the arrow 41a in FIG. 3, and the grinding wheel 424 of the grinding means 42 is rotated at 6000 rpm, for example, in the direction shown by an arrow 424a in FIG. 3. At the same time, a feed mechanism (not shown) is operated to lower the grinding wheel 424 until the abrasive members 426 come into contact with the back side 2b of the semiconductor wafer 2 as shown in FIG. 4. Thereafter, the grinding wheel 424 is fed downward (in the direction perpendicular to the holding surface of the chuck table 41) by a predetermined amount at a feed rate of 1 μm/second, for example, as shown by an arrow 424b in FIGS. 3 and 4. As a result, the back side 2b of the semiconductor wafer 2 is ground to reduce the thickness of the semiconductor wafer 2 to a predetermined thickness (e.g., 100 μm).

After performing the back grinding step as mentioned above, a modified layer forming step is performed in such a manner that the protective member attached to the front side 2a of the semiconductor wafer 2 is held on a chuck table of a laser processing apparatus and a laser beam having a transmission wavelength to the semiconductor wafer 2 is applied from the back side 2b of the semiconductor wafer 2 along each division line 21 in the condition where the focal point of the laser beam is set inside the semiconductor wafer 2 to thereby form a modified layer inside the semiconductor wafer 2 along each division line 21. This modified layer forming step is performed by using a laser processing apparatus 5 shown in FIG. 5. The laser processing apparatus 5 shown in FIG. 5 includes a chuck table 51 for holding a workpiece, laser beam applying means 52 for applying a laser beam to the workpiece held on the chuck table 51, and imaging means 53 for imaging the workpiece held on the chuck table 51. The chuck table 51 has an upper surface as a holding surface for holding the workpiece under suction. The chuck table 51 is movable both in a feeding direction shown by an arrow X in FIG. 5 and in an indexing direction shown by an arrow Y in FIG. 5 by means of a moving mechanism (not shown).

The laser beam applying means 52 includes a cylindrical casing 521 extending in a substantially horizontal direction and focusing means 522 mounted on the front end of the casing 521 for applying a pulsed laser beam to the workpiece. The imaging means 53 is mounted on the front end portion of the casing 521 of the laser beam applying means 52. The imaging means 53 includes an ordinary imaging device (CCD) for imaging the workpiece by using visible light, infrared light applying means for applying infrared light to the workpiece, an optical system for capturing the infrared light applied to the workpiece by the infrared light applying means, and an imaging device (infrared CCD) for outputting an electrical signal corresponding to the infrared light captured by the optical system. An image signal output from the imaging means is transmitted to control means (not shown).

Figure 5:
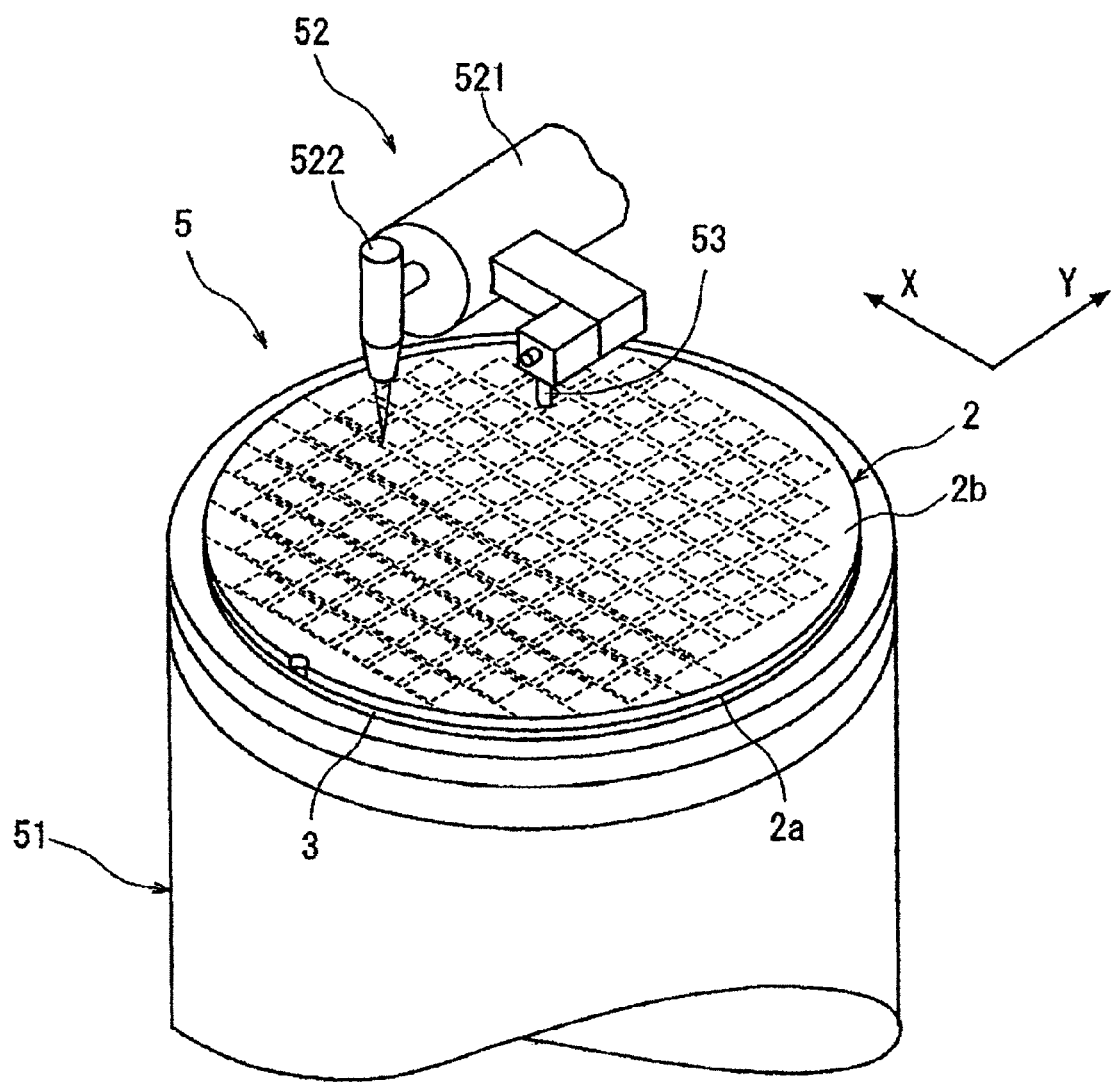
FIG. 5 is a perspective view of an essential part of a laser processing apparatus for performing a modified layer forming step.

The modified layer forming step using the laser processing apparatus 5 will now be described with reference to FIGS. 5 to 6B. First, the semiconductor wafer 2 with the protective tape 3 is placed on the chuck table 51 of the laser processing apparatus 5 shown in FIG. 5 in the condition where the protective tape 3 attached to the front side 2a of the semiconductor wafer 2 is in contact with the upper surface of the chuck table 51. Thereafter, suction means (not shown) is operated to hold the semiconductor wafer 2 through the protective tape 3 on the chuck table 51 under suction (wafer holding step). Accordingly, the back side 2b of the semiconductor wafer 2 held on the chuck table 51 is oriented upward. Thereafter, the chuck table 51 holding the semiconductor wafer 2 is moved to a position directly below the imaging means 53 by operating feeding means (not shown).

In the condition where the chuck table 51 is positioned directly below the imaging means 53, an alignment operation is performed by the imaging means 53 and the control means (not shown) to detect a subject area of the semiconductor wafer 2 to be laser-processed. More specifically, the imaging means 53 and the control means perform image processing such as pattern matching for making the alignment of the division lines 21 extending in a first direction on the semiconductor wafer 2 and the focusing means 522 of the laser beam applying means 52 for applying the laser beam to the wafer 2 along the division lines 21, thus performing the alignment of a laser beam applying position (alignment step). Similarly, this alignment step is performed for the other division lines 21 extending in a second direction perpendicular to the first direction on the semiconductor wafer 2. Although the front side 2a of the semiconductor wafer 2 on which the division lines 21 are formed is oriented downward, the division lines 21 can be imaged through the semiconductor wafer 2 from the back side 2b thereof because the imaging means 53 includes the infrared light applying means for applying infrared light to the wafer 2, the optical system for capturing the infrared light applied to the wafer 2, and the imaging means (infrared CCD) for outputting an electrical signal corresponding to the infrared light captured by the optical system as described above.

Figure 6A:
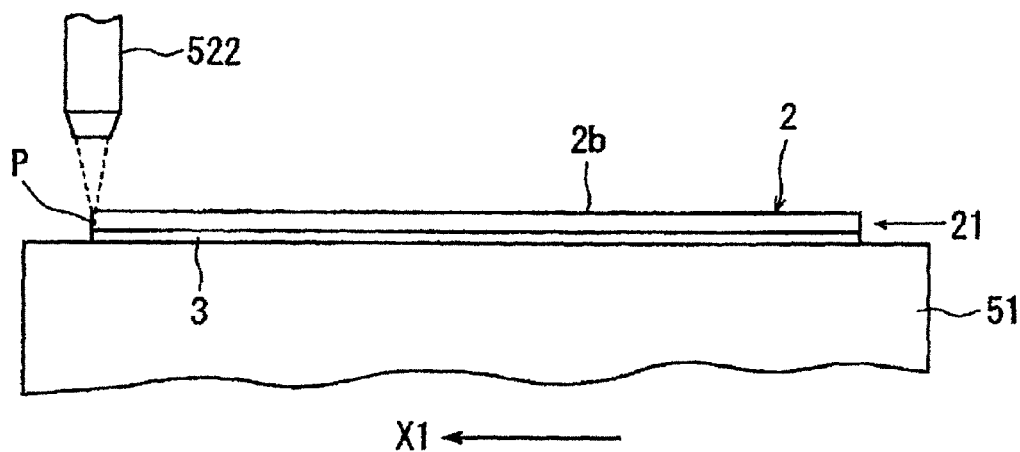
FIGS. 6A and 6B are sectional side views for illustrating the modified layer forming step.
Figure 6B:
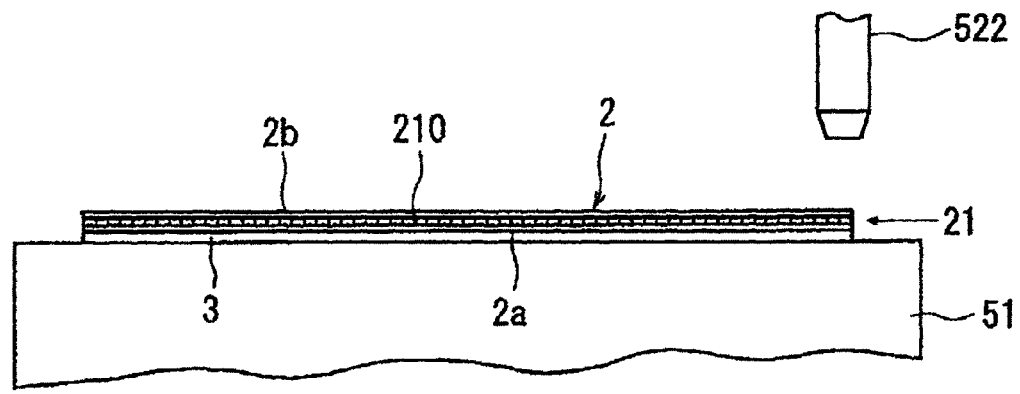

After performing the alignment step mentioned above to detect all of the division lines 21 of the semiconductor wafer 2 held on the chuck table 51, the chuck table 51 is moved to a laser beam applying area where the focusing means 522 of the laser beam applying means 52 is located as shown in FIG. 6A, thereby positioning one end (left end as viewed in FIG. 6A) of a predetermined one of the division lines 21 extending in the first direction directly below the focusing means 522. Further, the focal point P of the pulsed laser beam to be applied from the focusing means 522 is set at an intermediate position in the direction along the thickness of the semiconductor wafer 2. Thereafter, the pulsed laser beam having a transmission wavelength to the semiconductor wafer 2 (silicon wafer) is applied from the focusing means 522 to the semiconductor wafer 2, and the chuck table 51 (i.e., the semiconductor wafer 2) is moved at a predetermined feed speed in the direction shown by an arrow X1 in FIG. 6A. When the other end (right end as viewed in FIG. 6B) of the predetermined division line 21 reaches the position directly below the focusing means 522 as shown in FIG. 6B, the application of the pulsed laser beam is stopped and the movement of the chuck table 51 (i.e., the semiconductor wafer 2) is also stopped. As a result, a modified layer 210 is formed inside the semiconductor wafer 2 along the predetermined division line 21.

For example, the modified layer forming step mentioned above is performed under the following processing conditions.

Light source: Nd:YAG pulsed laser
Wavelength: 1064 nm
Repetition frequency: 100 kHz
Average power: 0.3 W
Focused spot diameter: 1 µm
Work feed speed: 100 mm/second After performing the modified layer forming step along the predetermined division line 21 as mentioned above, the chuck table 51 is moved in the indexing direction shown by the arrow Y in FIG. 5 by the pitch of the division lines 21 formed on the semiconductor wafer 2 (indexing step), and the modified layer forming step is similarly performed along the next division line 21 extending in the first direction. In this manner, the modified layer forming step is performed along all of the division lines 21 extending in the first direction. Thereafter, the chuck table 51 is rotated 90 degrees to similarly perform the modified layer forming step along all of the other division lines 21 extending in the second direction perpendicular to the first direction.

Figure 7A:
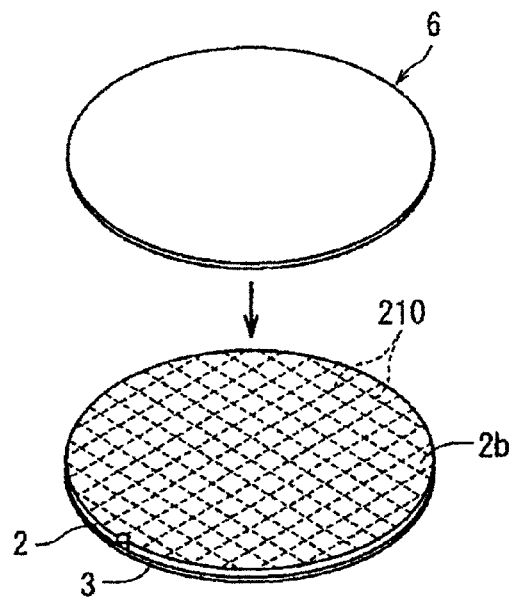
FIGS. 7A to 7C are perspective views for illustrating a preferred embodiment of a wafer supporting step.
Figure 7B:
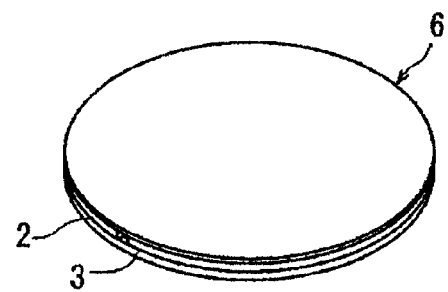
Figure 7C:
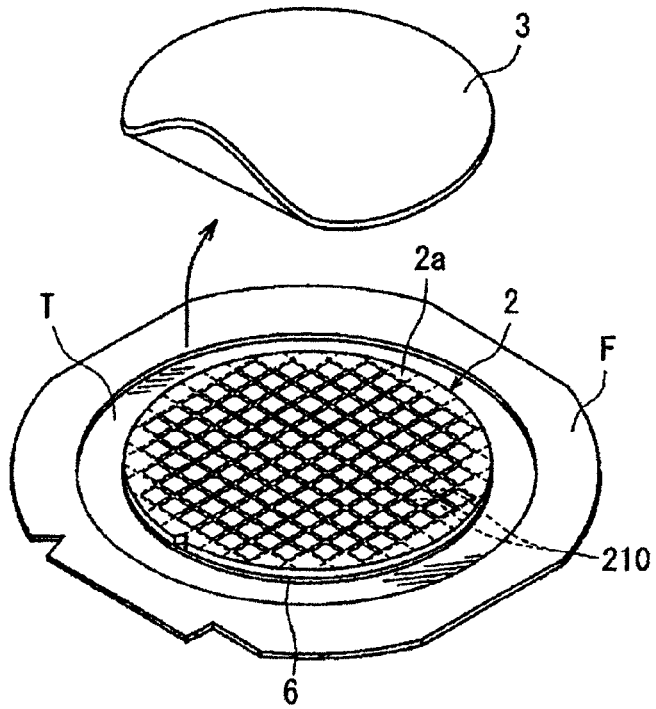

After performing the modified layer forming step along all of the division lines 21 extending in the first and second directions as mentioned above, a wafer supporting step is performed in such a manner that a reinforcing sheet having an insulating function is mounted on the back side 2b of the semiconductor wafer 2, a dicing tape is next attached to the reinforcing sheet, and the peripheral portion of the dicing tape is supported by an annular frame. More specifically, as shown in FIGS. 7A and 7B, a reinforcing sheet 6 having an insulating function is mounted on the back side 2b of the semiconductor wafer 2 (reinforcing sheet mounting step). The reinforcing sheet 6 has tackiness and it is formed from a resin sheet to be hardened by heating. After performing the reinforcing sheet mounting step, the reinforcing sheet 6 mounted on the back side 2b of the semiconductor wafer 2 is attached to an expansible dicing tape T supported at its peripheral portion to an annular frame F as shown in FIG. 7C. Further, the protective tape 3 attached to the front side 2a of the semiconductor wafer 2 is peeled off (protective tape peeling step). In the preferred embodiment shown in FIGS. 7A to 7C, the reinforcing sheet 6 mounted on the back side 2b of the semiconductor wafer 2 is attached to the dicing tape T supported to the annular frame F. As a modification, the dicing tape T may be attached to the reinforcing sheet 6 mounted on the back side 2*b* of the semiconductor wafer 2, and the peripheral portion of the dicing tape T may be simultaneously mounted on the annular frame F.

Figure 8A:
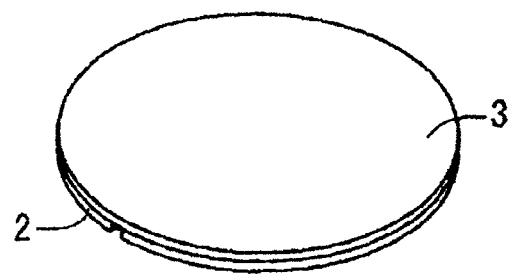
FIGS. 8A and 8B are perspective views for illustrating another preferred embodiment of the wafer supporting step.
Figure 8A:
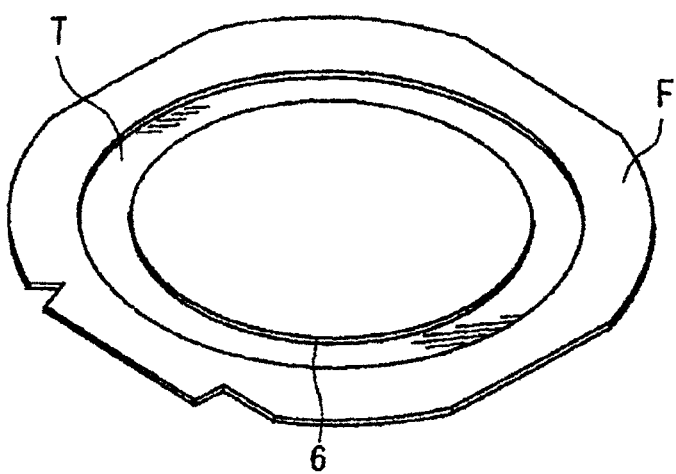
Figure 8B:
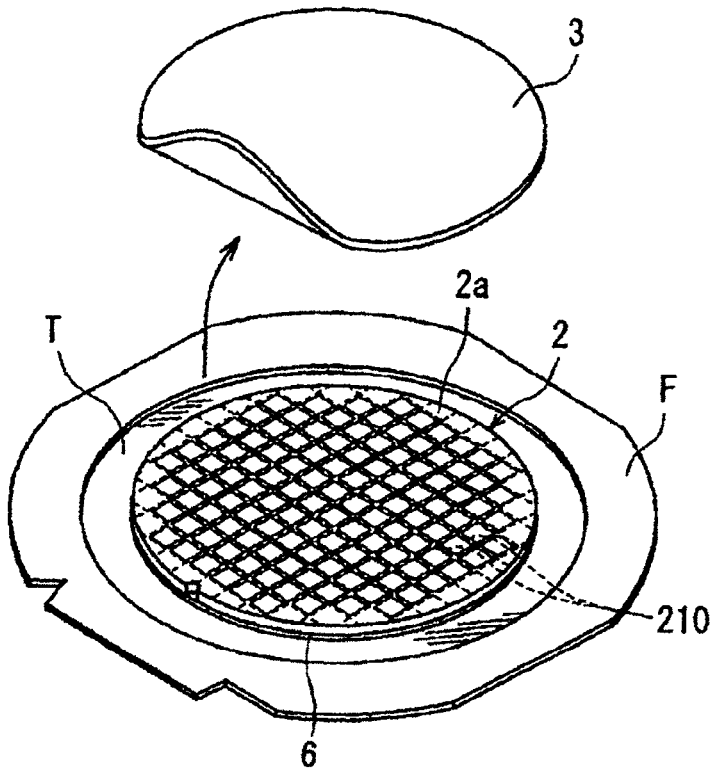

Another preferred embodiment of the wafer supporting step will now be described with reference to FIGS. 8A and 8B. The preferred embodiment shown in FIGS. 8A and 8B uses a dicing tape with a reinforcing sheet such that the reinforcing sheet 6 is preliminarily attached to the dicing tape T. More specifically, as shown in FIG. 8A, the reinforcing sheet 6 is preliminarily attached to the dicing tape T supported at its peripheral portion to the annular frame F so as to close the inner opening of the annular frame F. In this condition, the back side 2*b* of the semiconductor wafer 2 is mounted on the reinforcing sheet 6. In the case of using such a dicing tape with a reinforcing sheet as mentioned above, the back side 2*b* of the semiconductor wafer 2 is mounted on the reinforcing sheet 6 preliminarily attached to the dicing tape T, so that the semiconductor wafer 2 with the reinforcing sheet 6 mounted thereon is supported through the dicing tape T to the annular frame F. Thereafter, the protective tape 3 attached to the front side 2*a* of the semiconductor wafer 2 is peeled off as shown in FIG. 8B (protective tape peeling step). In the preferred embodiment shown in FIGS. 8A and 8B, the back side 2*b* of the semiconductor wafer 2 is mounted on the reinforcing sheet 6 attached to the dicing tape T supported at its peripheral portion to the annular frame F. As a modification, the reinforcing sheet 6 attached to the dicing tape T may be mounted on the back side 2*b* of the semiconductor wafer 2, and the peripheral portion of the dicing tape T may be simultaneously mounted on the annular frame F.

As described above, the wafer supporting step of mounting the reinforcing sheet 6 having an insulating function on the back side 2*b* of the semiconductor wafer 2, attaching the dicing tape T to the reinforcing sheet 6, and supporting the peripheral portion of the dicing tape T to the annular frame F is performed after performing the modified layer forming step mentioned above. Accordingly, even in the case of attaching the reinforcing sheet 6 to the back side 2*b* of the semiconductor wafer 2, it is possible to perform the modified layer forming step as internal processing of forming the modified layer 210 inside the semiconductor wafer 2 along each division line 21.

Figure 9:
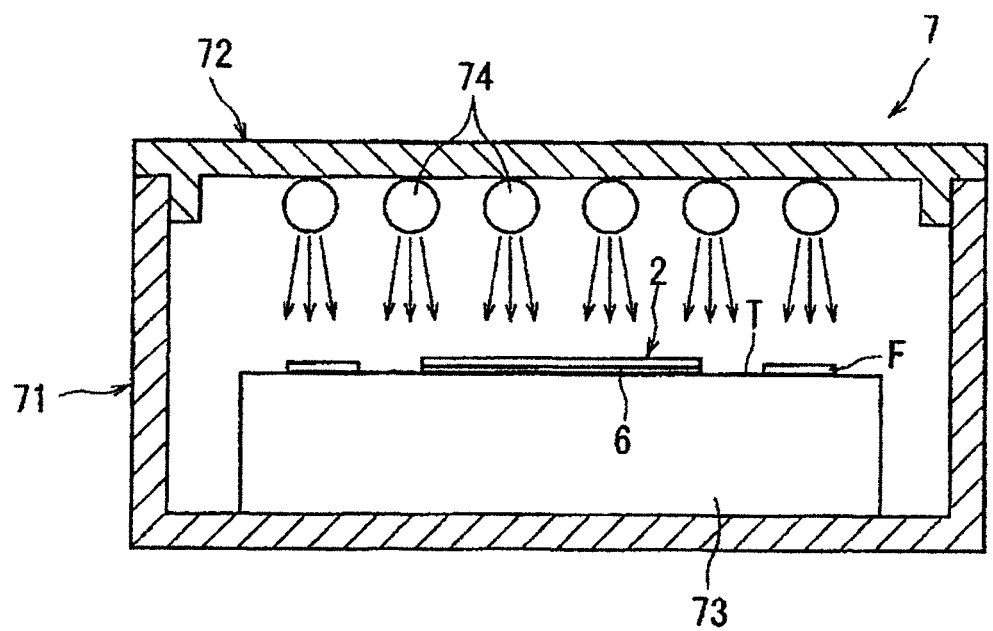
FIG. 9 is a sectional side view for illustrating a reinforcing sheet heating step.

After performing the wafer supporting step as mentioned above, a reinforcing sheet heating step is performed in such a manner that the semiconductor wafer 2 is heated to heat the reinforcing sheet 6 mounted on the back side 2*b* of the semiconductor wafer 2, thereby hardening the reinforcing sheet 6. This reinforcing sheet heating step is performed by using a heating apparatus 7 shown in FIG. 9. The heating apparatus 7 includes a treatment case 71 having an upper opening, a case lid 72 for closing the upper opening of the treatment case 71, a workpiece mounting table 73 provided in the treatment case 71 for mounting the workpiece, and a heater 74 provided on the inner surface of the case lid 72. The reinforcing sheet heating step using the heating apparatus 7 having the above configuration is performed in the following manner. First, the case lid 72 is opened and the semiconductor wafer 2 with the reinforcing sheet 6 is placed on the workpiece mounting table 73 in the condition where the dicing tape T attached to the reinforcing sheet 6 mounted on the back side 2*b* of the semiconductor wafer 2 is in contact with the workpiece mounting table 73. Accordingly, the front side 2*a* of the semiconductor wafer 2 placed through the dicing tape T on the workpiece mounting table 73 is oriented upward. Thereafter, the case lid 72 is closed and the heater 74 is operated to heat the semiconductor wafer 2 placed on the workpiece mounting table 73 and thereby heat the reinforcing sheet 6 mounted on the back side 2*b* of the semiconductor wafer 2. For example, this heating is performed at 130° C. for two hours in the reinforcing sheet heating step. As a result, the reinforcing sheet 6 mounted on the back side 2*b* of the semiconductor wafer 2 is hardened.

Figure 10:
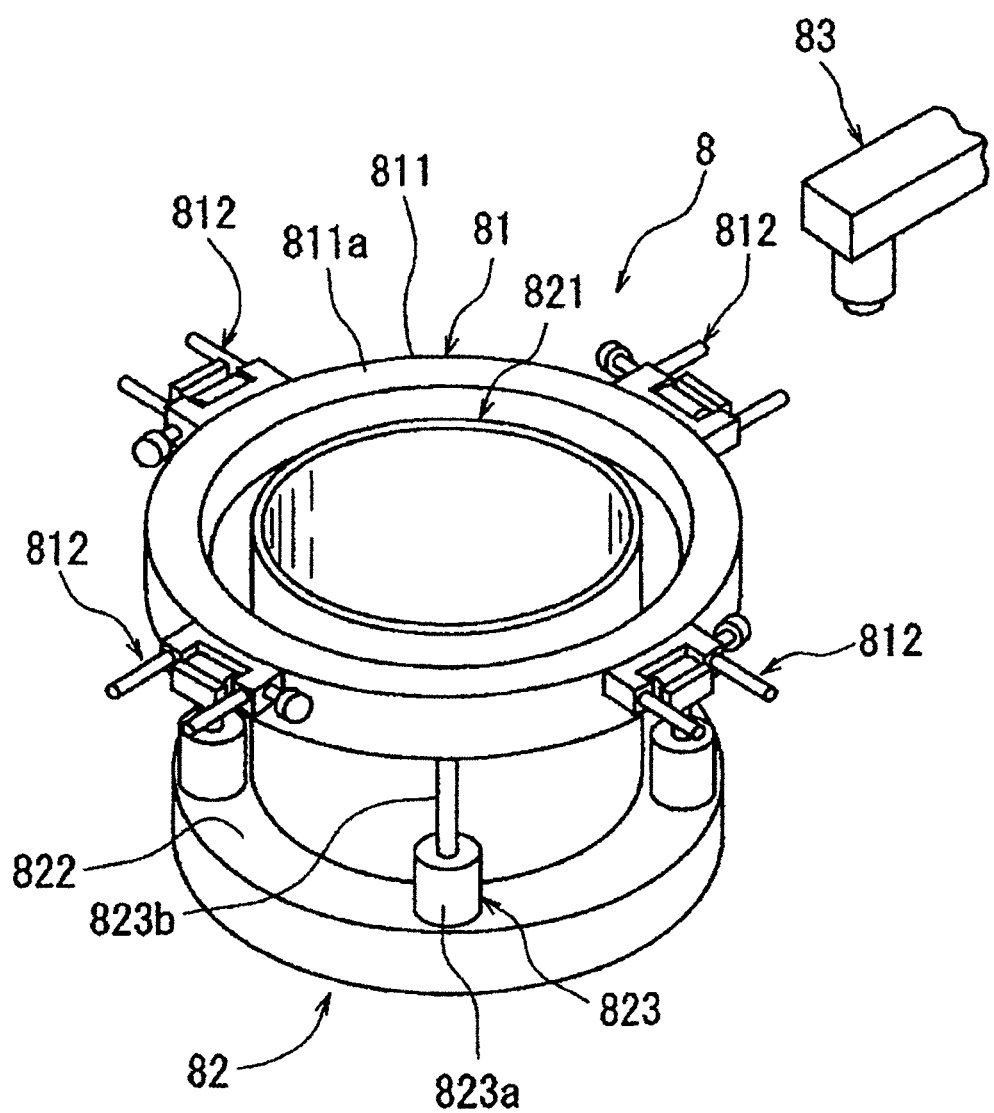
FIG. 10 is a perspective view of a tape expanding apparatus for performing a dividing step.

After performing the reinforcing sheet heating step as mentioned above, a dividing step is performed in such a manner that an external force is applied to the semiconductor wafer 2 to thereby divide the semiconductor wafer 2 into the individual devices 22 along each division line 21 where the modified layer 210 is formed and to also break the reinforcing sheet 6 along the individual devices 22. This dividing step is performed by using a tape expanding apparatus 8 shown in FIG. 10. The tape expanding apparatus 8 shown in FIG. 10 includes frame holding means 81 for holding the annular frame F, tape expanding means 82 for expanding the dicing tape T supported to the annular frame F held by the frame holding means 81, and a pickup collet 83. The frame holding means 81 includes an annular frame holding member 811 and a plurality of clamps 812 as fixing means provided on the outer circumference of the frame holding member 811. The upper surface of the frame holding member 811 functions as a mounting surface 811*a* for mounting the annular frame F thereon. The annular frame F mounted on the mounting surface 811*a* is fixed to the frame holding member 811 by the clamps 812. The frame holding means 81 is supported by the tape expanding means 82 so as to be vertically movable.

Figure 11A:
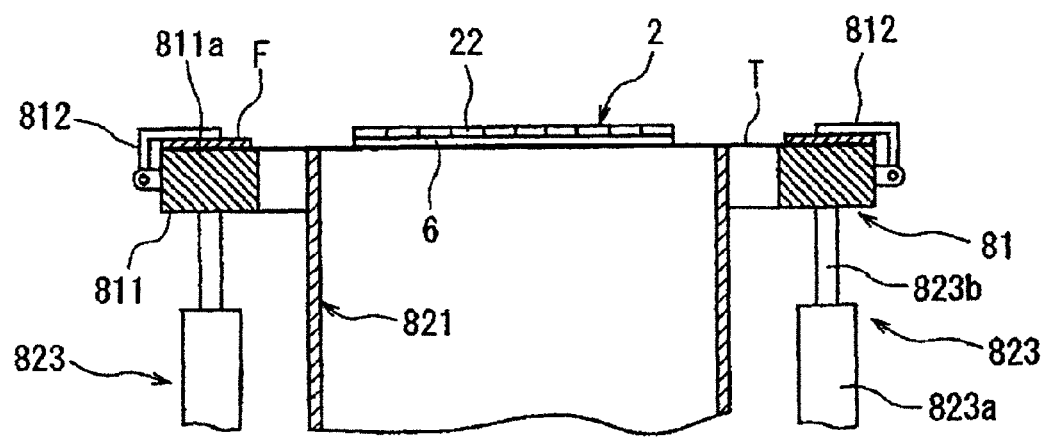
FIGS. 11A and 11B are sectional side views for illustrating the dividing step.
Figure 11B:
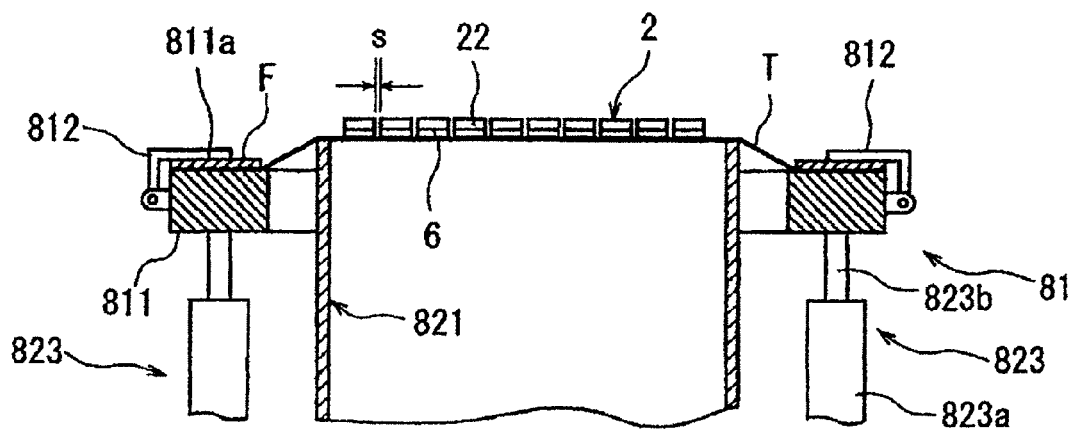

The tape expanding means 82 includes an expanding drum 821 provided inside of the annular frame holding member 811. The expanding drum 821 has an outer diameter smaller than the inner diameter of the annular frame F and an inner diameter larger than the outer diameter of the semiconductor wafer 2 attached to the dicing tape T supported to the annular frame F. The expanding drum 821 has a supporting flange 822 at the lower end of the drum 821. The tape expanding means 82 further includes supporting means 823 for vertically movably supporting the annular frame holding member 811. The supporting means 823 includes a plurality of air cylinders 823*a* provided on the supporting flange 822. Each air cylinder 823*a* is provided with a piston rod 823*b* connected to the lower surface of the annular frame holding member 811. The supporting means 823 including these plural air cylinders 823*a* functions to vertically move the annular frame holding member 811 so as to selectively tape a reference position where the mounting surface 811*a* is substantially equal in height to the upper end of the expanding drum 821 as shown in FIG. 11A and an expansion position where the mounting surface 811*a* is lower in height than the upper end of the expanding drum 821 by a predetermined amount as shown in FIG. 11B.

The dividing step using the tape expanding apparatus 8 will now be described with reference to FIGS. 11A and 11B. As shown in FIG. 11A, the annular frame F supporting the semiconductor wafer 2 having the reinforcing sheet 6 through the dicing tape T is mounted on the mounting surface 811*a* of the frame holding member 811 of the frame holding means 81. Thereafter, the annular frame F is fixed to the frame holding member 811 by the clamps 812 (frame holding step). At this time, the frame holding member 811 is set at the reference position shown in FIG. 11A. Thereafter, the air cylinders 823*a* as the supporting means 823 of the tape expanding means 82 are operated to lower the frame holding member 811 to the expansion position shown in FIG. 11B. Accordingly, the annular frame F fixed to the mounting surface 811*a* of the frame holding member 811 is also lowered, so that the dicing tape T supported to the annular frame F comes into abutment against the upper end of the expanding drum 821 and is expanded as shown in FIG. 11B (tape expanding step). As a result, a tensile force radially acts on the reinforcing sheet 6 attached to the dicing tape T and the semiconductor wafer 2 mounted on the reinforcing sheet 6. Accordingly, the semiconductor wafer 2 is divided into the individual devices 22 along the division lines 21 where the modified layers 210 are formed as division start points. At the same time, a spacing S is formed between any adjacent ones of the individual devices 22. Accordingly, the reinforcing sheet 6 hardened by the reinforcing sheet heating step is broken along the individual devices 22 by the tensile force.

Figure 12A:
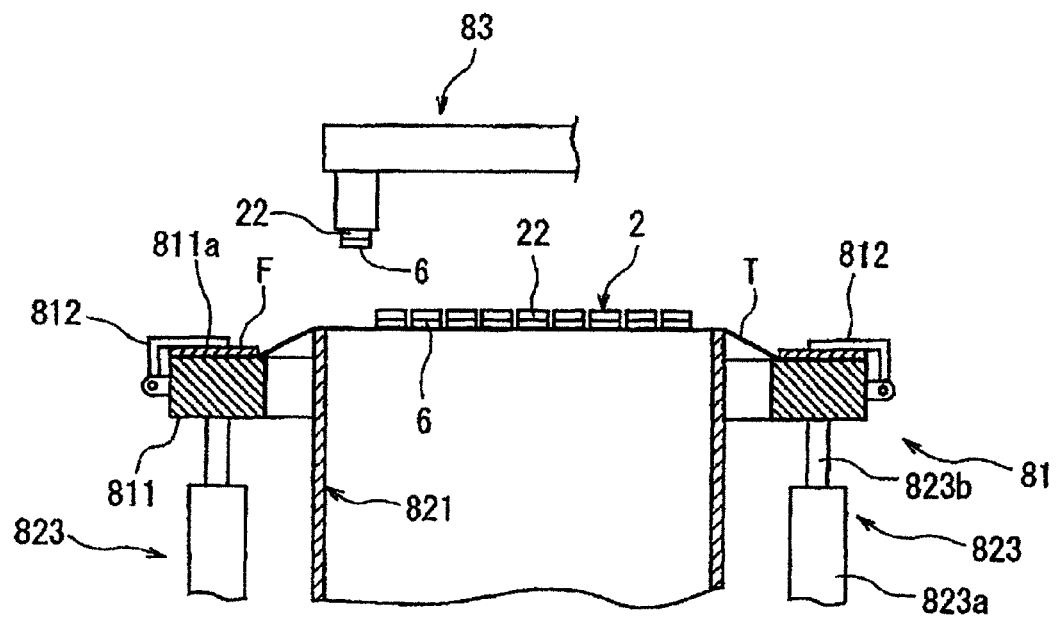
FIGS. 12A and 12B are views for illustrating a pickup step.
Figure 12B:
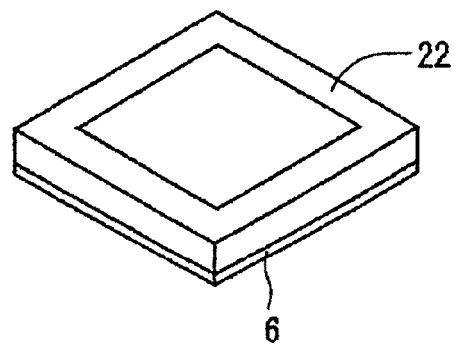

Thereafter, the pickup collet 83 is operated to hold each device 22 (the reinforcing sheet 6 being mounted on the back side of each device 22) under suction and peel it from the dicing tape T, thereby individually picking up the devices 22 as shown in FIG. 12A (pickup step). As a result, each semiconductor device 22 with the reinforcing sheet 6 mounted on the back side is obtained in the condition where the periphery of the reinforcing sheet 6 is flush with the periphery of each device 22. In the pickup step, each device 22 with the reinforcing sheet 6 can be easily picked up without the contact with its adjacent device 22 with the reinforcing sheet 6 because the spacing S is formed between any adjacent ones of the individual devices 22 attached through the reinforcing sheet 6 to the dicing tape T.

Having thus described a specific preferred embodiment of the present invention, it should be noted that the present invention is not limited to the above preferred embodiment, but various modifications may be made within the scope of the present invention. For example, while the dividing step is performed after performing the reinforcing sheet heating step in the above preferred embodiment, the dividing step may be performed before performing the reinforcing sheet heating step. That is, the reinforcing sheet heating step may be performed after performing the dividing step.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer processing method for dividing a wafer into individual devices along a plurality of crossing division lines formed on a front side of said wafer, said individual devices being formed in a plurality of separate regions defined by said division lines, said wafer processing method comprising:
   a protective member attaching step of attaching a protective member to the front side of said wafer;
   a back grinding step of holding said protective member attached to the front side of said wafer by said protective member attaching step on a chuck table of a grinding apparatus and grinding a back side of said wafer to reduce the thickness of said wafer to a predetermined thickness;
   a modified layer forming step of holding said protective member attached to said wafer ground by said back grinding step on a chuck table of a laser processing apparatus and applying a laser beam having a transmission wavelength to said wafer from the back side of said wafer along each division line in the condition where the focal point of said laser beam is set inside said wafer to thereby form a modified layer inside said wafer along each division line;
   a wafer supporting step of mounting a reinforcing sheet having an insulating function on the back side of said wafer processed by said modified layer forming step, attaching a dicing tape to said reinforcing sheet, and supporting the peripheral portion of said dicing tape to an annular frame;
   a reinforcing sheet heating step of heating said wafer processed by said wafer supporting step to heat said reinforcing sheet mounted on the back side of said wafer, thereby hardening said reinforcing sheet; and
   a dividing step of applying an external force to said wafer to thereby divide said wafer into said individual devices along each division line where said modified layer is formed and to also break said reinforcing sheet along said individual devices.

2. The wafer processing method according to claim 1, wherein said dividing step is performed before performing said reinforcing sheet heating step.

3. The wafer processing method according to claim 1, wherein said wafer supporting step includes a step of preliminarily attaching said reinforcing sheet to said dicing tape and next mounting said reinforcing sheet to the back side of said wafer.

4. The wafer processing method according to claim 1, further comprising a protective member peeling step of peeling off said protective member attached to the front side of said wafer before performing said reinforcing sheet heating step.

5. The wafer processing method according to claim 2, further comprising a protective member peeling step of peeling off said protective member attached to the front side of said wafer before performing said dividing step.

6. The method according to claim 1, wherein said reinforcing sheet heating step is performed before performing said dividing step.

* * * * *

UNITED STATES PATENT AND TRADEMARK OFFICE
CERTIFICATE OF CORRECTION

| | | |
|---|---|---|
| PATENT NO. | : 9,093,519 B2 | Page 1 of 1 |
| APPLICATION NO. | : 14/504059 | |
| DATED | : July 28, 2015 | |
| INVENTOR(S) | : Yamashita et al. | |

It is certified that error appears in the above-identified patent and that said Letters Patent is hereby corrected as shown below:

On the title page, item 30, Add the following: -- Foreign Application Priority Data Oct. 7, 2013 (JP) 2013-210092 --.

Signed and Sealed this
Twenty-second Day of March, 2016

Michelle K. Lee
*Director of the United States Patent and Trademark Office*